(12) United States Patent
Enzmann et al.

(10) Patent No.: US 11,316,084 B2
(45) Date of Patent: Apr. 26, 2022

(54) RADIATION-EMITTING SEMICONDUCTOR COMPONENT AND METHOD FOR PRODUCING RADIATION-EMITTING SEMICONDUCTOR COMPONENT

(71) Applicant: OSRAM OLED GmbH, Regensburg (DE)

(72) Inventors: Roland Heinrich Enzmann, Penang (MY); Hubert Halbritter, Dietfurt (DE); Martin Rudolf Behringer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 6 days.

(21) Appl. No.: 16/650,100

(22) PCT Filed: Sep. 20, 2018

(86) PCT No.: PCT/EP2018/075488
§ 371 (c)(1),
(2) Date: Mar. 24, 2020

(87) PCT Pub. No.: WO2019/063412
PCT Pub. Date: Apr. 4, 2019

(65) Prior Publication Data
US 2020/0227602 A1 Jul. 16, 2020

(30) Foreign Application Priority Data
Sep. 26, 2017 (DE) ............ 10 2017 122 325.8

(51) Int. Cl.
*H01L 33/58* (2010.01)
*H01L 33/00* (2010.01)
(Continued)

(52) U.S. Cl.
CPC .......... *H01L 33/58* (2013.01); *H01L 33/0095* (2013.01); *H01L 33/46* (2013.01); *H01L 33/62* (2013.01); *H01L 2933/0058* (2013.01)

(58) Field of Classification Search
CPC ..... H01L 33/58; H01L 33/0095; H01L 33/46; H01L 33/62; H01L 2933/0058
(Continued)

(56) References Cited

U.S. PATENT DOCUMENTS

2007/0164195 A1 7/2007 Kaneko
2007/0241354 A1* 10/2007 Tanaka .................. H01S 5/0422
257/98
(Continued)

FOREIGN PATENT DOCUMENTS

DE 102017100997 A1 7/2018
EP 1191608 A2 3/2002
(Continued)

OTHER PUBLICATIONS

International Search Report and Written Opinion of the International Searching Authority, dated Dec. 4, 2018, in related International Application No. PCT/EP2018/075488, 13 pages.
(Continued)

*Primary Examiner* — Igwe U Anya
(74) *Attorney, Agent, or Firm* — MH2 Technology Law Group LLP

(57) ABSTRACT

A radiation-emitting semiconductor device (1) is specified, comprising a semiconductor body (2) having an active region (20) provided for generating radiation, a carrier (3) on which the semiconductor body is arranged and an optical element (4), wherein the optical element is attached to the semiconductor body by a direct bonding connection.
Furthermore, a method for producing of radiation-emitting semiconductor devices is specified.

13 Claims, 10 Drawing Sheets

Figure 1:
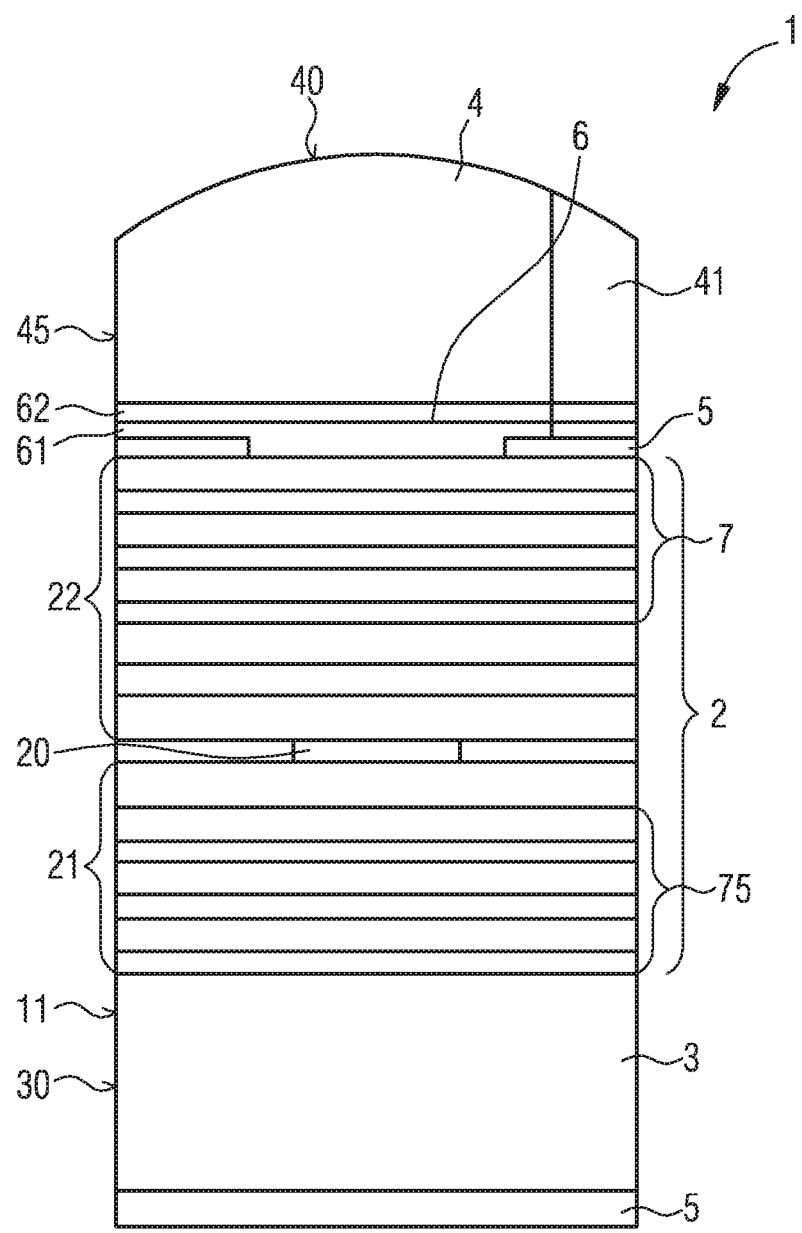

(51) Int. Cl.
*H01L 33/46* (2010.01)
*H01L 33/62* (2010.01)

(58) Field of Classification Search
USPC .................................................. 257/98
See application file for complete search history.

(56) References Cited

U.S. PATENT DOCUMENTS

| | | | |
|---|---|---|---|
| 2012/0153306 A1* | 6/2012 | Yao | H01L 33/58 257/88 |
| 2012/0181568 A1* | 7/2012 | Hsia | H01L 24/24 257/99 |
| 2012/0225509 A1* | 9/2012 | Wang | H01L 33/62 438/27 |
| 2013/0223466 A1 | 8/2013 | Gronenborn et al. | |
| 2013/0320293 A1 | 12/2013 | Seo et al. | |
| 2014/0191265 A1* | 7/2014 | Camras | H01L 33/32 257/98 |
| 2016/0341852 A1 | 11/2016 | Daeschner et al. | |

FOREIGN PATENT DOCUMENTS

| | | |
|---|---|---|
| JP | 2001156396 A | 6/2001 |
| JP | 2002026452 A | 1/2002 |
| JP | 2002141556 A | 5/2002 |
| JP | 2003188460 A | 7/2003 |
| JP | 2003225902 A | 8/2003 |
| JP | 2003318485 A | 11/2003 |
| JP | 2003333590 A | 11/2003 |
| JP | 2004311861 A | 11/2004 |
| JP | 2005080982 A | 3/2005 |
| JP | 200666538 A | 3/2006 |
| JP | 2006125907 A | 5/2006 |
| JP | 201062267 A | 3/2010 |
| JP | 2012023375 A | 2/2012 |
| JP | 2012511824 A | 5/2012 |
| JP | 2013160455 A | 8/2013 |
| WO | 2008035283 A2 | 3/2008 |
| WO | 2011021139 A2 | 2/2011 |

OTHER PUBLICATIONS

Japanese Office Action dated Jun. 15, 2021 for corresponding Japanese Application No. 2020-515028, 17 pages.

* cited by examiner

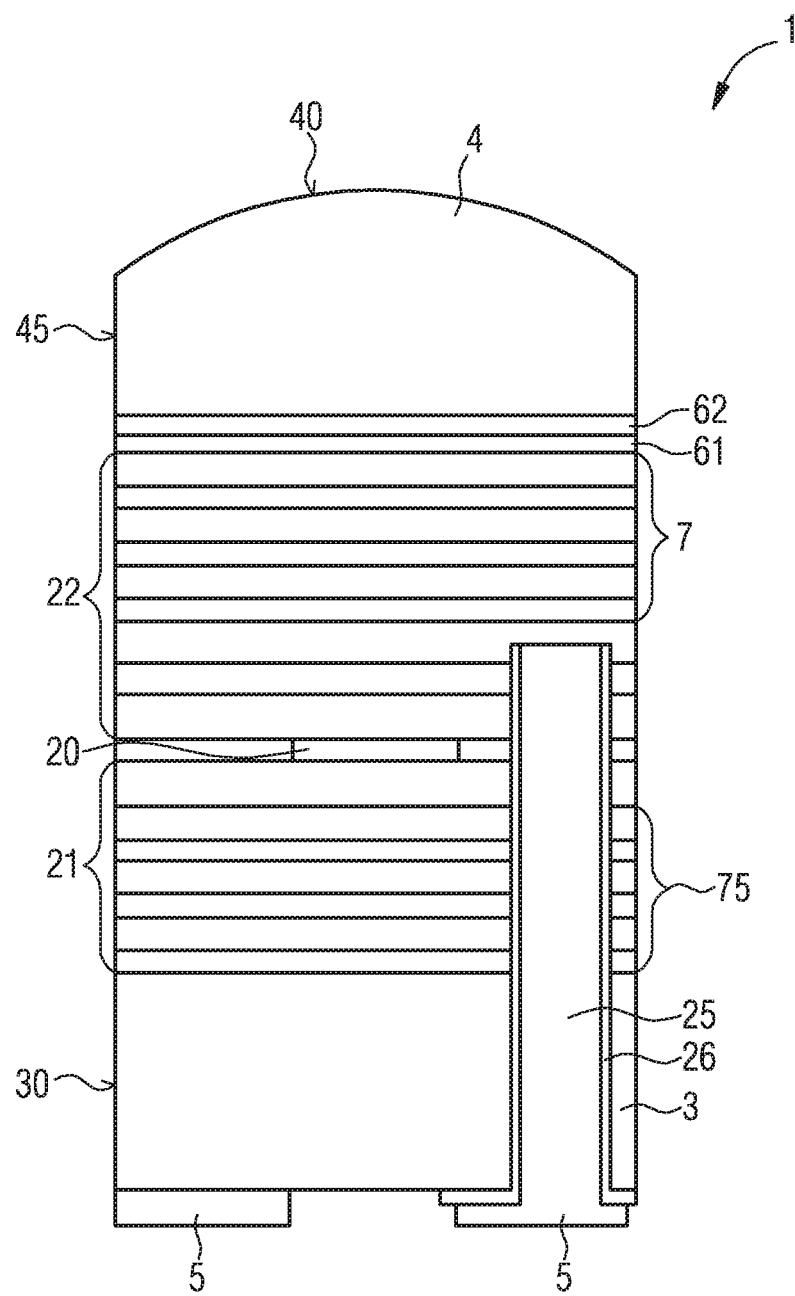

RADIATION-EMITTING SEMICONDUCTOR COMPONENT AND METHOD FOR PRODUCING RADIATION-EMITTING SEMICONDUCTOR COMPONENT

CROSS-REFERENCE TO RELATED APPLICATION(S)

This application is a national stage entry from International Application No. PCT/EP2018/075488, filed on Sep. 20, 2018, published as International Publication No. WO 2019/063412 on Apr. 4, 2019, and claims priority under 35 U.S.C. § 119 from German Patent Application No. 102017122325.8, filed on Sep. 26, 2017, the entire contents of all of which are incorporated herein by reference.

The present application relates to a radiation-emitting semiconductor device and a method for producing radiation-emitting semiconductor devices.

For beam shaping, optical elements are often placed on radiation-emitting semiconductor chips. However, an individual assembly of such optical elements is expensive, time-consuming and complex, in particular when a high positioning accuracy is required.

An object is to specify a semiconductor device, which is produced easily and reliably and is characterized by good radiation properties. Furthermore, a method is to be specified with which semiconductor devices can be produced efficiently and with high accuracy.

These objects are solved by a radiation-emitting semiconductor device or a method according to the independent claims. Further developments and expediencies are the subject-matter of the pending claims.

A radiation-emitting semiconductor device is specified.

According to at least one embodiment of the radiation-emitting semiconductor device, the radiation-emitting semiconductor device has a semiconductor body having an active region provided for generating radiation. For example, the active region is part of a semiconductor layer sequence that is in particular epitaxially deposited. For example, the active region is arranged between a first semiconductor region and a second semiconductor region, wherein the first semiconductor region and the second semiconductor region are different from one another at least in places with respect to the conductivity type, so that the active region is located in a pn-junction. The active region, for example, is intended to generate electromagnetic radiation in the ultraviolet, visible or infrared spectral range.

According to at least one embodiment of the radiation-emitting semiconductor device, the radiation-emitting semiconductor device has a carrier on which the semiconductor body is arranged. The carrier serves in particular for the mechanical stabilization of the semiconductor body. For example, the carrier is a growth substrate for the epitaxial deposition of the semiconductor body or a carrier different from the growth substrate.

According to at least one embodiment of the radiation-emitting semiconductor device, the radiation-emitting semiconductor device has an optical element. The optical element is intended in particular to shape, for example to focus, collimate or expand the radiation emitted from the active region according to a predetermined radiation characteristic, in particular a spatial radiation characteristic. The optical element is formed to be transmissive, in particular for the radiation generated in the active region.

According to at least one embodiment of the radiation-emitting semiconductor device, the optical element is attached to the semiconductor body with a direct bonding connection.

In the case of a direct bonding connection, the connecting partners to be connected to one another, which are in particular prefabricated, are held together by atomic and/or molecular forces, in particular by means of hydrogen bonds and/or Van der Waals interactions. A direct bonding connection is typically produced between two flat interfaces solely under the influence of pressure and/or temperature. A joining layer such as an adhesive layer or a solder layer is not required for a direct bonding connection. Absorption losses in such a joining layer can be avoided.

The interfaces, between which the direct bonding connection is formed, preferably have a root-mean-squared roughness (also known as rms roughness) of at most 5 nm, in particular at most 3 nm or at most 1 nm.

The semiconductor body and the optical element need not necessarily directly adjoin one another. For example, one or two auxiliary bonding layers can be arranged between the semiconductor body and the optical element. For example, an oxide layer, such as a layer containing silicon dioxide, is suitable as auxiliary bonding layer. The auxiliary bonding layer is expediently formed to be transmissive to the radiation to be generated in the active region, for example with a transmission of at least 90% or at least 95%. This applies analogously to any further auxiliary bonding layer that may be present.

In at least one embodiment of the radiation-emitting semiconductor device, the radiation-emitting semiconductor device comprises a semiconductor body having an active region provided for generating radiation, a carrier on which the semiconductor body is arranged, and an optical element, wherein the optical element is attached to the semiconductor body by a direct bonding connection.

During the production of the radiation-emitting semiconductor device, the direct bonding connection between the optical element and the semiconductor body can still be produced in the composite simultaneously for a plurality of semiconductor devices. At the same time, a direct bonding connection is characterized by high reliability, in particular over a wide temperature range. The attachment in a composite can be achieved with a particularly high accuracy, in particular when compared to the individual attachment of individual optical elements on individual semiconductor bodies. For example, the optical element is attached to the associated semiconductor body with an accuracy of 1 micrometre or less.

According to at least one embodiment of the radiation-emitting semiconductor device, the carrier and the optical element terminate flush with a side surface delimiting the semiconductor device. During the production of the radiation-emitting semiconductor device, the carrier and the optical element can be severed in a common separation step. The carrier and the optical element can therefore have characteristic traces of the separation process, for example traces of mechanical material removal, such as saw marks, traces of chemical material removal, or traces of material removal by means of coherent radiation, such as a laser separation process.

Furthermore, the carrier, the optical element and the semiconductor body preferably terminate flush with a side surface delimiting the semiconductor device. The semiconductor body is preferably arranged between the carrier and the optical element. This is to say that the side surfaces of the semiconductor body preferably terminate flush with the side surfaces of the carrier and the side surfaces of the optical element. Furthermore, the carrier, the optical element and the semiconductor body can be severed in a common separation step during the production of the radiation-emitting semiconductor device. The carrier, the optical element and the semiconductor body can therefore have characteristic traces of the separation process, for example traces of mechanical material removal, such as saw marks, traces of chemical material removal or traces of material removal by means of coherent radiation, such as a laser separation process.

According to at least one embodiment of the radiation-emitting semiconductor device, a mirror region is arranged between the active region and the optical element. The mirror region, for example, is formed as a Bragg mirror. For example, the mirror region is a part of a resonator in which the active region is located. For example, the radiation-emitting semiconductor device is a vertical cavity surface emitting laser (VCSEL) or a resonant cavity light emitting diode (RCLED).

According to at least one embodiment of the radiation-emitting semiconductor device, the mirror region is arranged between the active region and the direct bonding connection. During the production of the radiation-emitting semiconductor device, the mirror region is thus located on the same side of the direct bonding connection as the active region. For example, the mirror region is a part of the semiconductor body or is arranged on the side of the semiconductor body facing the optical element.

A mirror region arranged outside the semiconductor body is, for example, formed by a plurality of dielectric layers. In contrast to a Bragg mirror integrated in the semiconductor body, individual layers of a dielectric Bragg mirror can exhibit comparatively large differences in the refractive index, so that a highly efficient Bragg mirror can be produced in a simplified manner.

A Bragg mirror integrated into the semiconductor body can be in particular formed electrically conductive, for example p-conductive or n-conductive. The electrical contacting of the active region can be produced through the mirror region.

According to at least one embodiment of the radiation-emitting semiconductor device, the mirror region is arranged between the direct bonding connection and the optical element. During the production of the radiation-emitting semiconductor device, the mirror region can be formed on the optical element even before the direct bonding connection is produced.

According to at least one embodiment of the radiation-emitting semiconductor device, the active region is divided into a plurality of segments. In particular, the segments can be externally electrically controlled independently of one another. For example, the majority of segments are arranged laterally next to one another in a one-dimensional or two-dimensional matrix. In particular, the optical element may extend continuously over the majority of segments. For example, the optical element has an optical segment for each segment, wherein the optical segments can be formed identically or differently with respect to their beam shaping.

For the external electrical contacting, the radiation-emitting semiconductor device has at least two contacts. By applying an external electrical voltage between the contacts, charge carriers can enter the active region from different sides and recombine there while emitting radiation.

According to at least one embodiment of the radiation-emitting semiconductor device, a contact for external electrical contacting of the semiconductor device is arranged on a side of the semiconductor body facing the optical element. The direct bonding connection adjoins an auxiliary bonding layer, in particular on a side facing the semiconductor body. The auxiliary bonding layer completely covers the contact and, for example, has a greater vertical extent in places than the contact. For example, during production of the radiation-emitting semiconductor device, the auxiliary bonding layer serves to planarize the surface facing the optical element.

A contact arranged on the side facing the optical element is formed, for example, ring-like so that the radiation generated in the active region can exit through the opening of the ring.

According to at least one embodiment of the radiation-emitting semiconductor device, the radiation-emitting semiconductor device has two contacts for external electrical contacting on a side of the semiconductor body facing away from the optical element, for example on a side of the carrier facing away from the semiconductor body. In particular, the side of the semiconductor body facing the optical element can be completely free of electrical contacts. In this case, the optical element can also completely cover the semiconductor body.

Furthermore, a method for producing radiation-emitting semiconductor devices is specified.

According to at least one embodiment of the method, a semiconductor layer sequence is provided with an active region provided for generating radiation on a carrier and with a first interface. The interface can be formed by the semiconductor layer sequence or by a layer arranged on the semiconductor layer sequence, for example an auxiliary bonding layer. The semiconductor layer sequence can already be divided into a plurality of semiconductor bodies. The active region of a semiconductor body can be divided into a plurality of segments.

According to at least one embodiment of the method, the method comprises a step in which an optics carrier with a second interface is provided. The second interface can be formed by the optics carrier or by a layer arranged on the optics carrier, for example a further auxiliary bonding layer.

According to at least one embodiment of the method, the method comprises a step in which a direct bonding connection is produced between the first interface and the second interface. This forms a composite with the carrier with the semiconductor layer sequence on the one hand and the optics carrier on the other.

According to at least one embodiment of the method, the method comprises a step in which a separation into the plurality of radiation-emitting semiconductor devices takes place, wherein the radiation-emitting semiconductor devices each comprise a part of the carrier, a part of the semiconductor layer sequence and a part of the optics carrier. In particular, the semiconductor layer sequence results in a semiconductor body for each radiation-emitting semiconductor device and an optical element from the optics carrier in each case.

During the production of the direct bonding connection, the carrier and the optics carrier can be positioned with a high accuracy with respect to one another, for example by using alignment marks which are arranged on the carrier and/or the optics carrier, in particular in each case in an edge region thereof.

In at least one embodiment of the method, a semiconductor layer sequence with an active region provided for generating radiation is provided on a carrier with a first interface. An optics carrier with a second interface is provided. A direct bonding connection is produced between the first interface and the second interface. A separation into the plurality of radiation-emitting semiconductor devices is carried out, wherein the radiation-emitting semiconductor devices each comprising a part of the carrier, a part of the semiconductor layer sequence and a part of the optics carrier.

According to at least one embodiment of the method, the optics carrier and the carrier are severed during the separation, in particular in a common separation step. In such semiconductor devices, the semiconductor body and the associated optical element can terminate flush with a side surface of the semiconductor device at least in places.

According to at least one embodiment of the method, the first interface and/or the second interface are smoothed, in particular chemo-mechanically polished, before the direct bonding connection is produced. Such a process, also known as CMP process, can produce particularly smooth surfaces with high efficiency and accuracy.

According to at least one embodiment of the method, a contact is arranged on the semiconductor layer sequence, wherein the contact is covered by the optics carrier during the production of the direct bonding connection and is exposed after the production of the direct bonding connection. The optics carrier can be completely removed in places in the vertical direction, i.e. perpendicular to a main plane of extension of the active region.

According to at least one embodiment of the method, a contact and an auxiliary bonding layer, which covers the contact, are arranged on the semiconductor layer sequence, wherein the auxiliary bonding layer is chemo-mechanically polished before the direct bonding connection is produced. This simplifies the production of a flat first interface. The bonding auxiliary layer can still completely cover the contact after polishing. The auxiliary bonding layer thus continuously forms an interface for the direct bonding connection.

Alternatively, it is also conceivable that the contact is at least partially or completely exposed after smoothing.

According to at least one embodiment of the method, a radiation exit surface of the optics carrier facing away from the carrier is formed after the direct bonding connection is produced. At the time of producing the direct bonding connection, the optics carrier can be formed in particular as a flat optics carrier, which itself does not have any beam shaping properties. The optical elements are thus only formed after the optics carrier is attached to the semiconductor layer sequence. In this case, a high-precision arrangement of the optics carrier relative to the carrier before the direct bonding connection is produced can be dispensed with.

According to at least one embodiment of the method, the optics carrier has a plurality of optical elements before the direct bonding connection is produced. After the direct bonding connection is produced, no further step is thus required to form the optical elements, apart from severing the optics carrier during separation.

The method is particularly suitable for the production of a radiation-emitting semiconductor device described above. Therefore, the features mentioned in connection with the radiation-emitting semiconductor device can also be used for the method and vice versa.

Further embodiments and expediencies result from the following description of the exemplary embodiments in connection with the Figures.

They show:

FIG. 1, FIG. 2, FIG. 3 and FIG. 4 each show an exemplary embodiment of a radiation-emitting semiconductor device using a schematic sectional view; and FIGS. 5A, 5B, 5C and 5D and FIGS. 6A and 6B each show an exemplary embodiment of a method for producing radiation-emitting semiconductor devices on the basis of intermediate steps each represented in schematic sectional view.

Identical, similar or similar-acting elements are marked with the same reference signs in the Figures.

The Figures are all schematic representations and therefore not necessarily true to scale. Rather, comparatively small elements and in particular layer thicknesses can be shown in exaggerated size for clarification.

FIG. 1 shows an exemplary embodiment of a radiation-emitting semiconductor device. The radiation-emitting semiconductor device 1 has a semiconductor body 2 with an active region 20 provided for generating radiation. The semiconductor body 2 is arranged on a carrier 3. For example, the carrier is a growth substrate for the epitaxial deposition of the semiconductor layers of the semiconductor body. The carrier can also be different from the growth substrate. In this case, the carrier can be attached to the semiconductor body 2 by means of a bonding layer.

The semiconductor device 1 further has an optical element 4. The optical element 4 is attached to the semiconductor body 2 by a direct bonding connection 6. The direct bonding connection is exemplarily formed between an auxiliary bonding layer 61 and a further auxiliary bonding layer 62. For example, the auxiliary bonding layer 61 and the further auxiliary bonding layer 62 each contain an oxide, such as a silicon oxide. In contrast thereto, the semiconductor device 1 can, however, also have only one auxiliary bonding layer or no auxiliary bonding layer.

The optical element 4 is formed transmissive for the radiation to be generated in the active region 20. For example, the optical element 4 has a glass, gallium phosphide, gallium nitride or silicon. Silicon is particularly suitable for radiation in the infrared spectral range with a wavelength of at least 1100 nm.

The optical element 4 is exemplarily formed as a refractive optics, which for example collimates or focuses the radiation to be generated. In plan view of the semiconductor device, the optical element has, for example, a convexly curved radiation exit surface 40. However, the optical element can also be formed, for example, for a beam widening or, in general, for a beam shaping according to a predetermined radiation characteristic.

Furthermore the optical element 4 can also be formed as a diffractive optical element. In the case of a diffractive optical element, the mode of operation is not based on refraction, but rather on diffraction of the radiation impinging on the optical element.

The optical element 4 and the carrier 3 form in places a part of the side surface 11, which delimits the semiconductor device 1 in the lateral direction. A side surface 45 of the optical element and a side surface 30 of the carrier terminate flush with one another on the side surface 11 of the semiconductor device 1.

For the external electrical contacting, the semiconductor device 1 has two contacts, wherein one of the contacts is arranged on the side of the semiconductor body 2 facing the optical element 4. The optical element 4 has a breakthrough 41 in which the contact 5 is exposed for the electrical contacting, for example, by means of a bonding wire. The breakthrough 41 also extends through the auxiliary bonding layers 61, 62, if present.

The semiconductor device 1, for example, is formed as a surface-emitting laser or as a light-emitting diode with resonant cavity. The active region 20 is arranged between a mirror region 7 and further mirror region 75.

In the exemplary embodiment shown, both mirror region 7 and the further mirror region 75 are part of the semiconductor body. The electrical contacting of the active region 20 is carried out through the mirror region 7 and the further mirror region 75.

The semiconductor body 2 comprises a first semiconductor region 21 and a second semiconductor region 22, wherein the first semiconductor region and the second semiconductor region are different from one another with respect of the charge type, and the active region is arranged between the first semiconductor region 21 and the second semiconductor region 22. The active region 20 is thus located in a pn-junction. The mirror region 7 is a part of the second semiconductor region 22, and the further mirror region 75 is a part of the first semiconductor region 21.

For example, the active region is provided for generation radiation in the ultraviolet, visible or infrared spectral range.

The semiconductor body 2, in particular the active region 20, preferably contains III-V compound semiconductor material.

III-V compound semiconductor materials are particularly suitable for generating radiation in the ultraviolet ($Al_xIn_yGa_{1-x-y}N$) over the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here, $0 \leq x \leq 1$, $0 \leq y \leq 1$ and $x+y \leq 1$ apply in each case, in particular with $x \neq 1$, $y \neq 1$, $x \neq 0$ and/or $y \neq 0$. With III-V compound semiconductor materials, in particular from the material systems mentioned, high internal quantum efficiencies can further be achieved during radiation generation.

Figure 2:
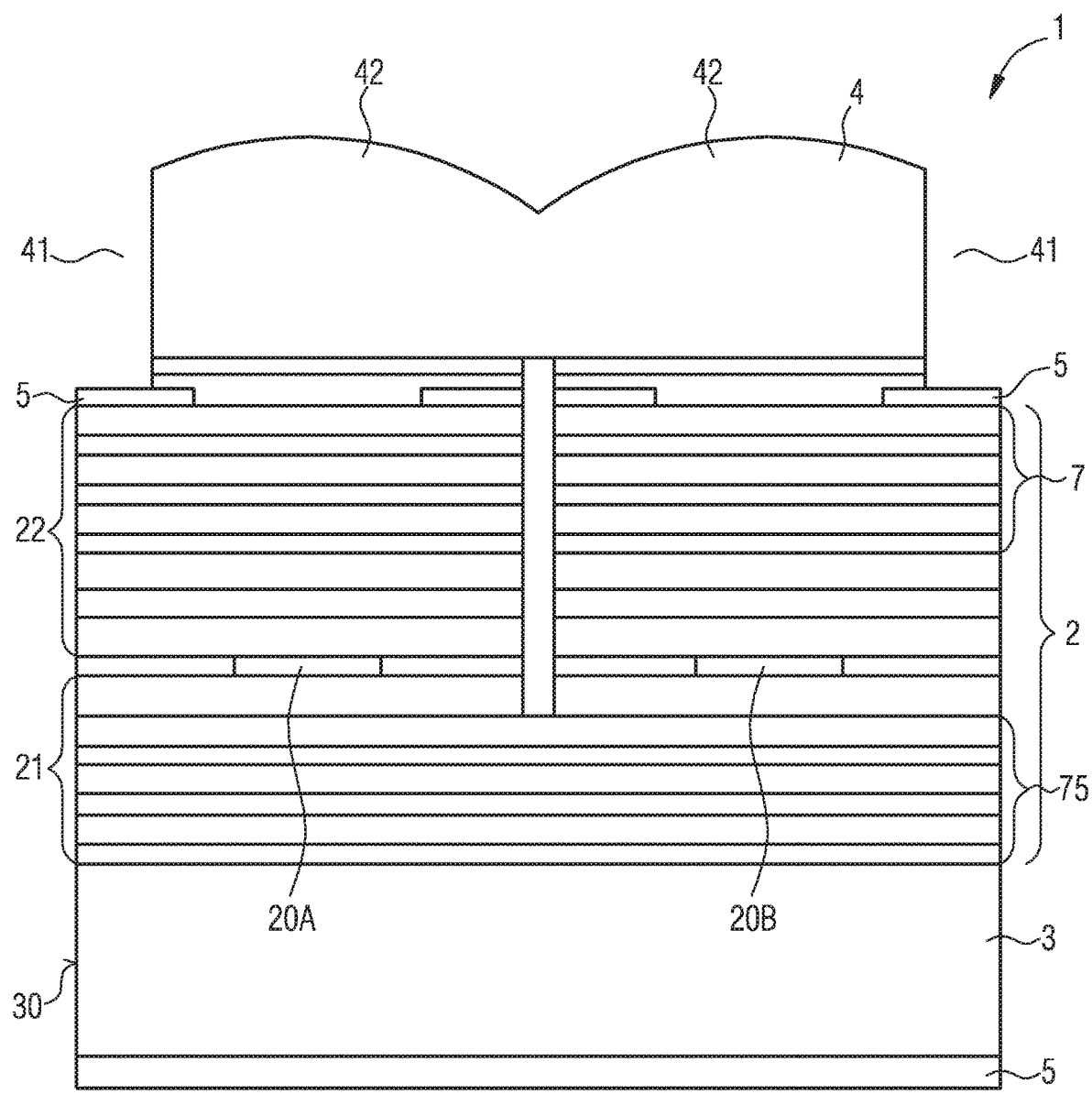

The exemplary embodiment shown in FIG. 2 substantially corresponds to the exemplary embodiment described in connection with FIG. 1. In contrast, the semiconductor device 1 has a plurality of segments 20A, 20B of the active region. The segments can be arranged next to one another in lateral direction, i.e. along a main plane of extension of the active region, in a rows-like or in a matrix-like manner.

The optical element 4 extends continuously over the segments 20A, 20B. The segments are each assigned to an optical segment 42, wherein the optical segments 42 are each formed in the same way with respect to their beam shaping properties. However, the optical segments 42 can differ from one another in terms of beam shaping. The segments 20A, 20B can each be externally electrically contacted independently of one another via assigned contacts 5. A contact 5 arranged on the side of the carrier 3 facing away from the semiconductor body 2 can form a common back contact for two or more, in particular all segments.

Such a segmentation of the active region can also be used for the exemplary embodiment described below.

Figure 3:
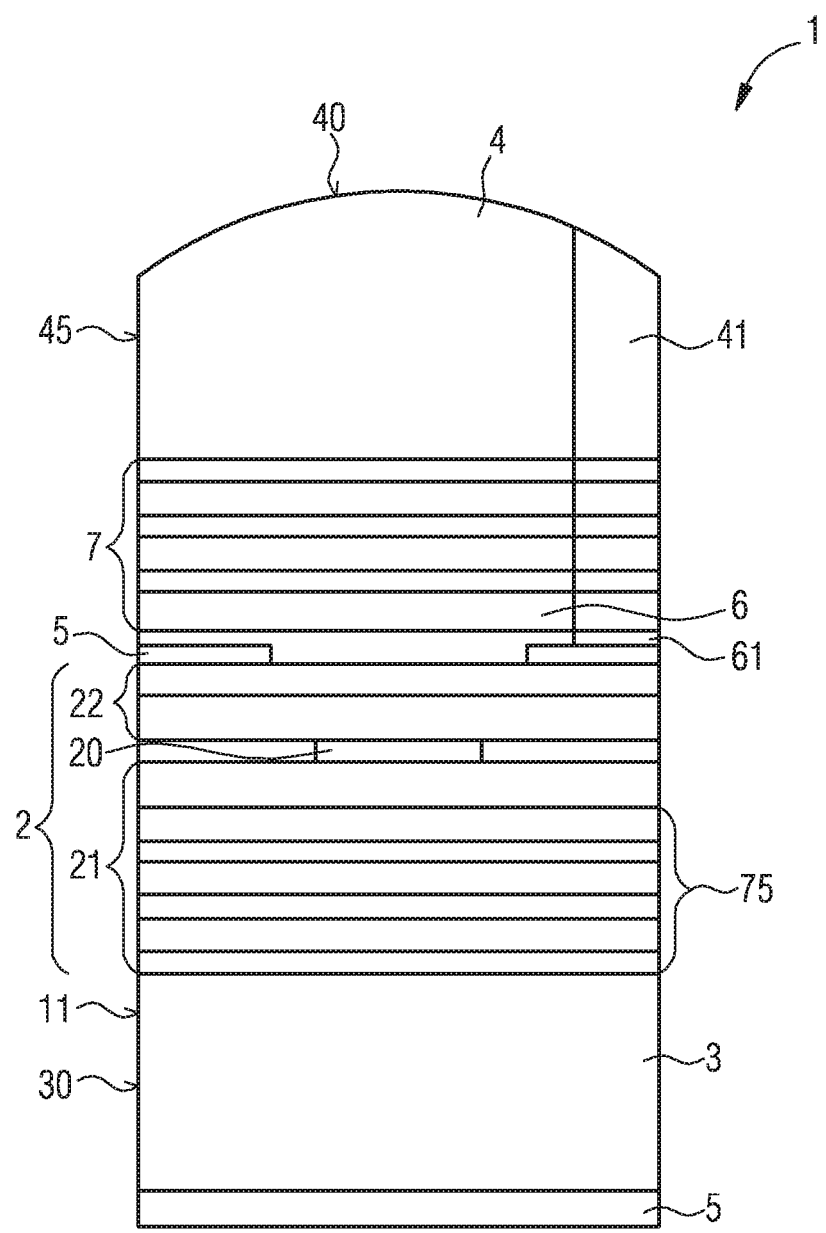

The exemplary embodiment shown in FIG. 3 substantially corresponds to the exemplary embodiment described in connection with FIG. 1. In contrast, the mirror region 7 is arranged between the direct bonding connection 6 and the optical element 4. During the production of the semiconductor device, the mirror region 7 can thus be formed separately from the semiconductor body 2 on the optical element 4. For example, the mirror region 7 is formed by a Bragg mirror in the form of several dielectric layers, wherein adjacent layers differ from one another in terms of their refractive indices.

The layer of the mirror region 7 closest to the semiconductor body 2 also forms the interface for the production of the direct bonding connection 6. In contrast, as described in connection with FIG. 1, a further auxiliary bonding layer can also be provided.

The exemplary embodiment shown in FIG. 4 substantially corresponds to the exemplary embodiment described in connection with FIG. 1.

In contrast thereto, the semiconductor device 1 has two contacts 5 for external electrical contacting on the side of the semiconductor body 2 facing away from the optical element 4, in particular on the side of the carrier 3 facing away from the optical element. On the side facing the optical element 4, the semiconductor body 2 is completely free of elements for external electrical contacting. The optical element 4 can completely cover the semiconductor body 2 without affecting the external electrical contacting of the semiconductor device 1. The second semiconductor region 22, which is arranged on the side of active region 20 facing away from carrier 3, is electrically contacted via a recess 25 in the semiconductor body. The recess 25 extends in particular through the active region 20. To avoid an electrical short of the active region 20, the recess is lined with an insulating layer 26.

FIGS. 5A to 5D show an exemplary embodiment of a method for producing semiconductor devices, wherein only one semiconductor device is produced exemplarily as described in connection with FIG. 1.

Figure 5A:
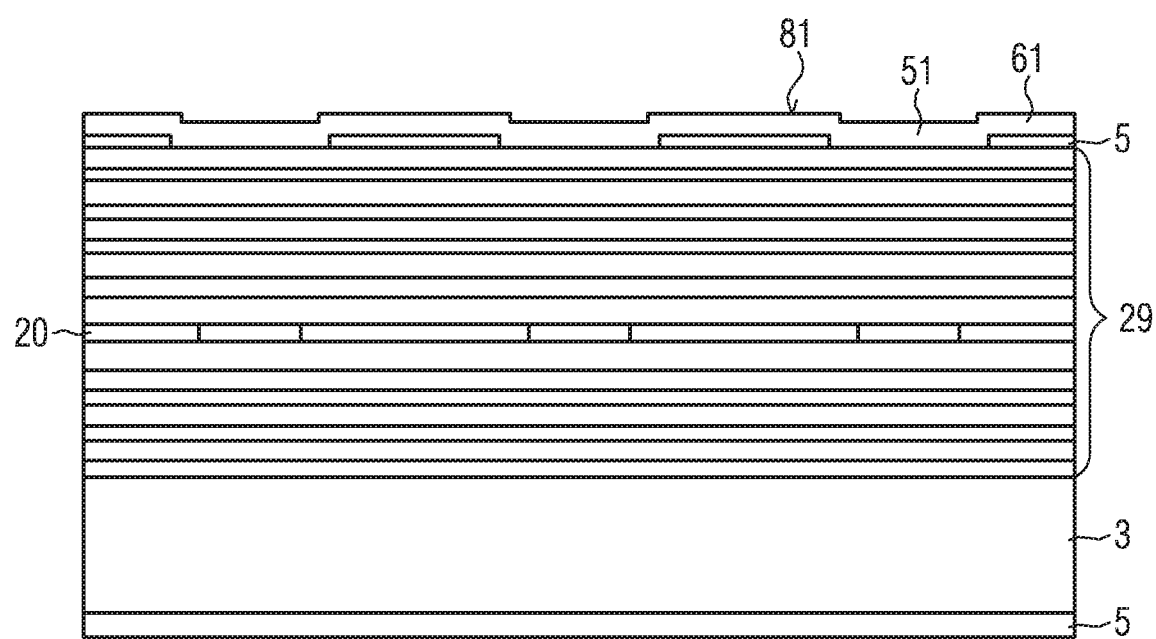

As shown in FIG. 5A, a semiconductor layer sequence 29 with an active region 20 provided for generating radiation is provided on a carrier 3. The semiconductor layer sequence 2 can already be structured into a plurality of semiconductor bodies in lateral direction. This is not shown for simplification.

A contact 5 is arranged on the side of the semiconductor layer sequence 29 facing away from carrier 3. An auxiliary bonding layer 61 completely covers the contact 5 and fills the interspaces 51 between the contacts 5. In the interspaces 51 the auxiliary bonding layer adjoins the semiconductor layer sequence 29. The auxiliary bonding layer 61 forms a first interface 81. Subsequently, the first interface 81 is levelled if necessary, as shown in FIG. 5B, for example by chemo-mechanical polishing.

Figure 5B:
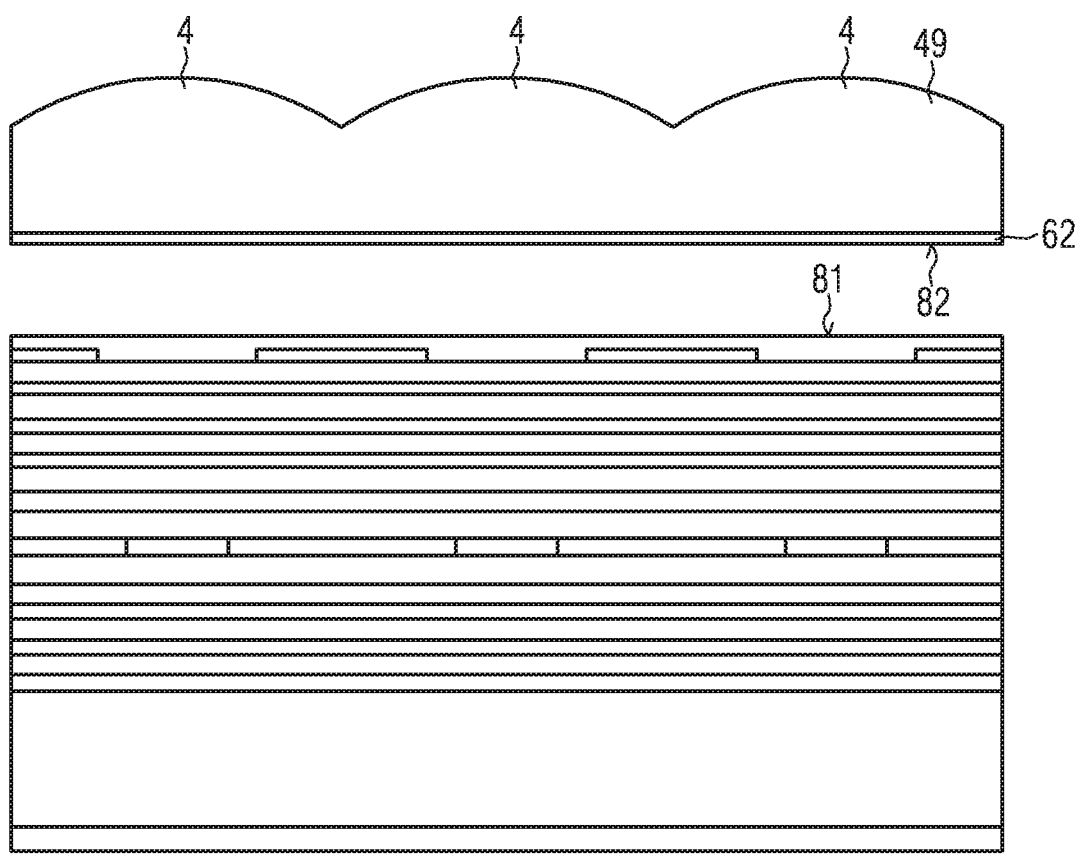

An optics carrier 49 is provided, wherein the optics carrier in the exemplary embodiment shown has a plurality of optical elements 4 (FIG. 5B). The optical elements 4 are formed continuously in the optics carrier 49. The optics carrier 49 completely covers the semiconductor layer sequence 29. A second interface 82 of the optics carrier 49 is exemplarily formed by means of a further auxiliary bonding layer 62.

A high-precision relative adjustment between the optics carrier 49 and the carrier 3 with the semiconductor layer sequence 29 can be achieved, for example, by means of alignment marks, which can be arranged at the edge of the optics carrier 49 and/or the carrier 3 with the semiconductor layer sequence 29. These are arranged outside the semiconductor devices to be produced and are therefore not explicitly shown in the Figures. Thus, accuracies of 1 μm or less of the relative adjustment between optics carrier and semiconductor layer sequence in lateral direction can be achieved.

Figure 5C:
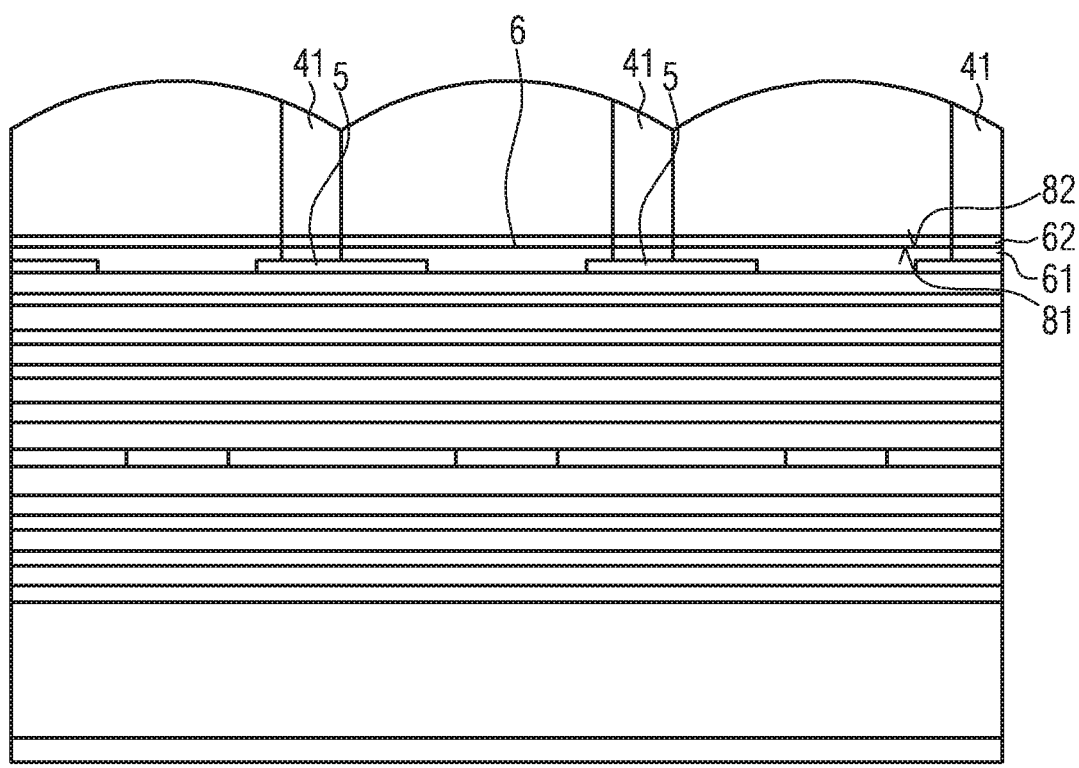

Subsequently, a direct bonding connection 6 is produced between the first interface 81 and the second interface 82, as shown in FIG. 5C.

The contacts 5 are exposed. For this purpose, a plurality of breakthroughs 41 are formed in the optics carrier 49, for example by etching.

Figure 5D:
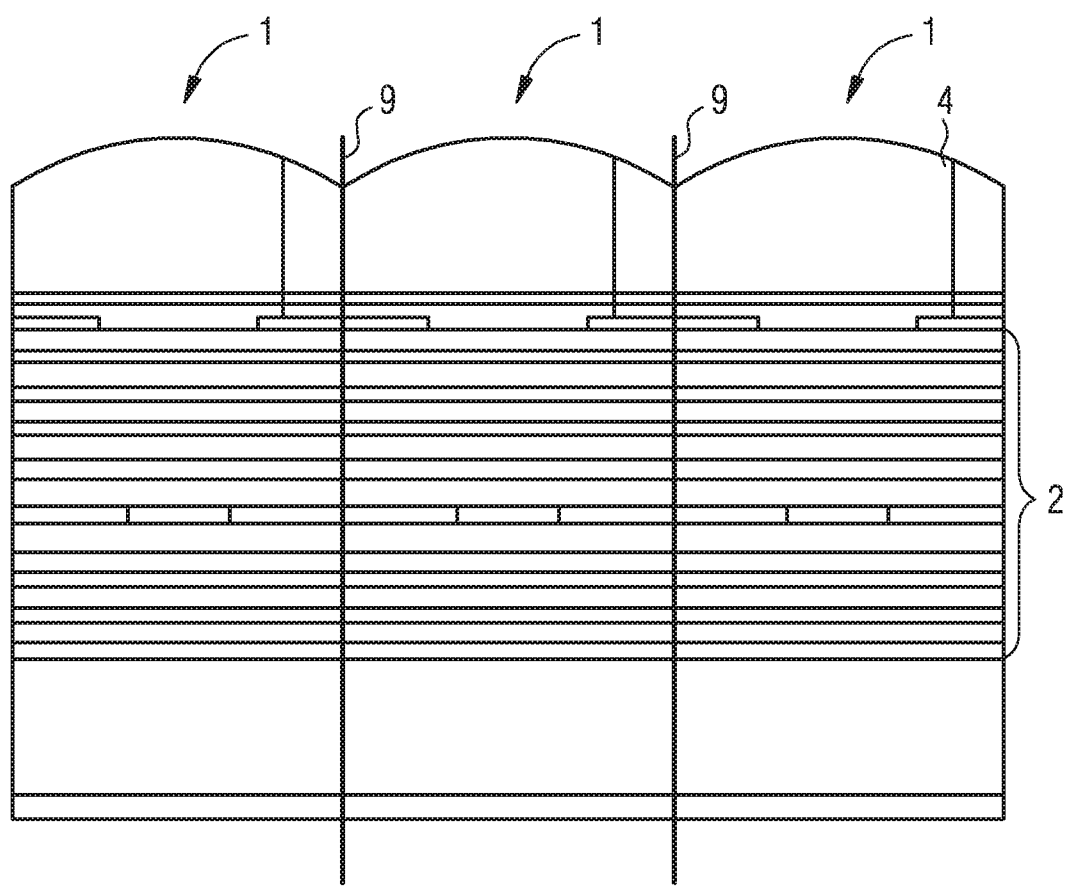

Finally, a separation into a plurality of semiconductor devices 1 is performed along separation lines 9 (FIG. 5D). During separation, the optics carrier 49 and the carrier 3 with the semiconductor layer sequence 29 are severed in such a way that the finished semiconductor devices each have a part of the carrier 3, a semiconductor body 2 formed from the semiconductor layer sequence 29 and an optical element 4. After separation, it is therefore no longer necessary to apply an optical element to each individual semiconductor device.

Separation can be carried out mechanically, for example by sawing, chemically, for example by etching, or by means of coherent radiation, for example by a laser separation process.

Figure 6A:
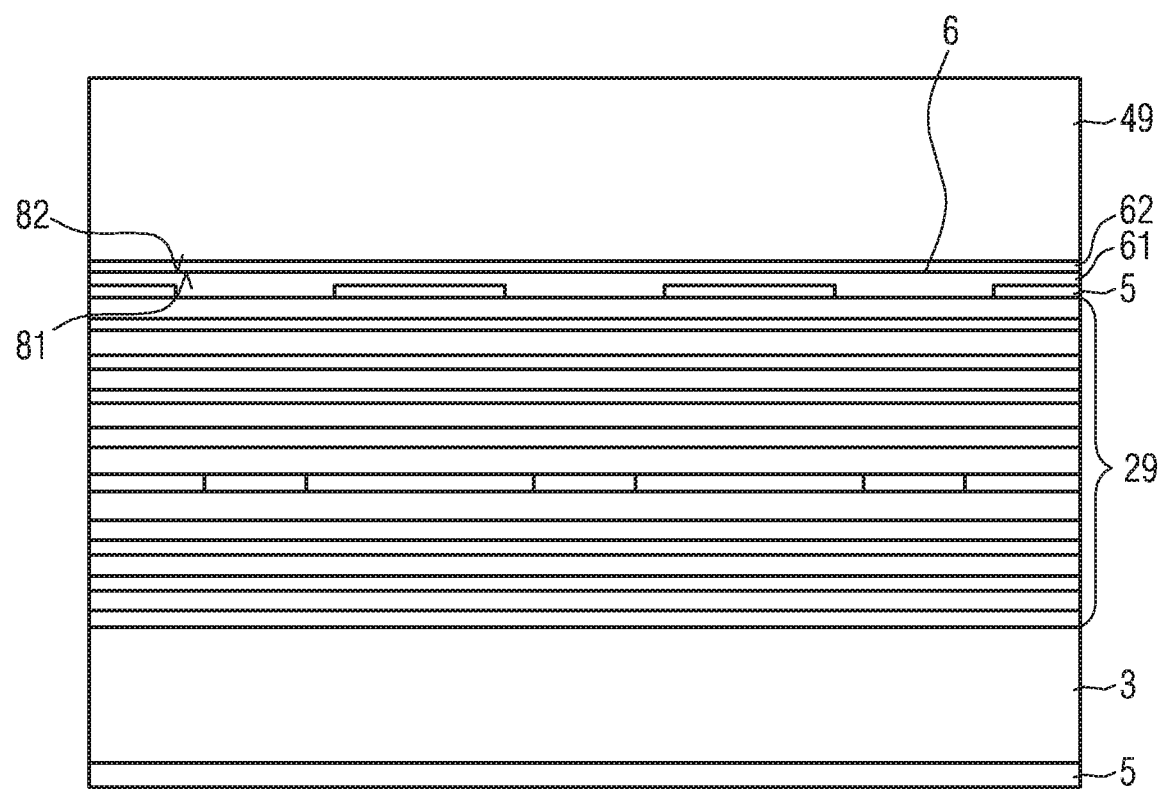
Figure 6B:
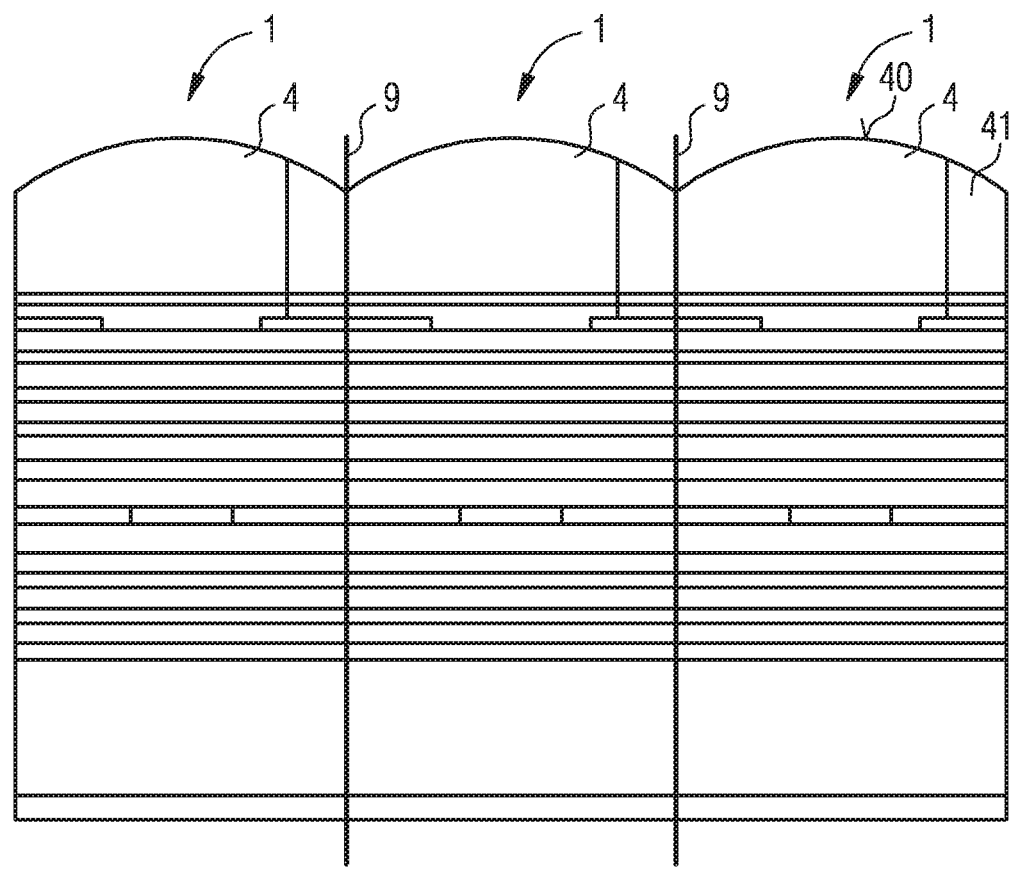

FIGS. 6A and 6B show another exemplary embodiment of a method. This exemplary embodiment substantially corresponds to the exemplary embodiment described in connection with FIGS. 5A to 5D.

In contrast thereto, the optics carrier 49 is attached to the carrier 3 with the semiconductor layer sequence 29 in a completely unstructured lateral direction by means of a direct bonding connection 6 (FIG. 6A). Only subsequently, the optics carrier 49 is processed at a radiation exit surface 40 facing away from the semiconductor layer sequence 29 in order to form the optical elements 4 (FIG. 6B). This can be carried out by an etching process, for example. In this case, a high-precision adjustment of the optics carrier 49 relative to the carrier 3 with the semiconductor layer sequence 29 can be dispensed with.

The further steps, such as the separation, can be carried out as described in connection with FIGS. 5A to 5D.

This patent application claims the priority of the German patent application 102017122325.8, the disclosure content of which is hereby incorporated by reference.

The invention is not limited by the description based on the exemplary embodiments. Rather, the invention comprises any new feature as well as any combination of features, which in particular includes any combination of features in the claims, even if this feature or combination itself is not explicitly stated in the claims or the exemplary embodiments.

The invention claimed is:

1. A radiation-emitting semiconductor device comprising
a semiconductor body having an active region provided for generating radiation;
a carrier on which the semiconductor body is arranged; and
an optical element,
wherein the optical element is attached to the semiconductor body with a direct bonding connection,
wherein a mirror region is arranged between the active region and the optical element, and
wherein the mirror region is arranged between the direct bonding connection and the optical element.

2. The radiation-emitting semiconductor device according to claim 1,
wherein the carrier and the optical element terminate flush with a side surface delimiting the semiconductor device.

3. The radiation-emitting semiconductor device according to claim 1,
wherein the active region is divided into a plurality of segments and the optical element extends continuously over the plurality of segments.

4. The radiation-emitting semiconductor device according to claim 1,
wherein
a contact for external electrical contacting of the semiconductor device is arranged on a side of the semiconductor body facing the optical element;
the direct bonding connection is adjacent to an auxiliary bonding layer on a side facing the semiconductor body; and
the auxiliary bonding layer completely covers the contact and in places has a greater vertical extent than the contact.

5. The radiation-emitting semiconductor device according to claim 1, wherein the radiation-emitting semiconductor device has two contacts for external electrical contacting on a side of the carrier facing away from the optical element.

6. A method for producing a plurality of radiation-emitting semiconductor devices, comprising the steps of:
a) providing a semiconductor layer sequence having an active region provided for generating radiation on a carrier and having a first interface, wherein a contact is arranged on the semiconductor layer sequence;
b) providing an optics carrier having a second interface;
c) producing a direct bonding connection between the first interface and the second interface; and
d) separating into the plurality of radiation-emitting semiconductor devices, wherein the radiation-emitting semiconductor devices each comprise a part of the carrier, the semiconductor layer sequence and the optics carrier, wherein the contact is covered by the optics carrier in step c) and is exposed after step c).

7. The method according to claim 6,
wherein in step d) the optics carrier and the carrier are severed.

8. The method according to claim 6,
wherein prior to step c), the first interface and/or the second interface are chemomechanically polished.

9. The method according to claim 6,
wherein the contact and an auxiliary bonding layer, which cover the contact, are arranged on the semiconductor layer sequence and the auxiliary bonding layer is chemomechanically polished prior to step c).

10. The method according to claim 6,
wherein a radiation exit surface of the optics carrier facing away from the carrier is formed after step c).

11. The method according to claim 6,
wherein the optics carrier comprises a plurality of optical elements prior to step c).

12. The method according to claim 6,
wherein a radiation-emitting semiconductor device is produced comprising a semiconductor body having an active region provided for generating radiation, a carrier on which the semiconductor body is arranged, and an optical element, wherein the optical element is attached to the semiconductor body with a direct bonding connection.

13. A radiation-emitting semiconductor device comprising
a semiconductor body having an active region provided for generating radiation;
a carrier on which the semiconductor body is arranged; and
an optical element, wherein
the optical element is attached to the semiconductor body with a direct bonding connection,
the optical element has a breakthrough, and
the breakthrough exposes a contact for an electrical contacting of the semiconductor body.

* * * * *